(12) United States Patent
Wada

(10) Patent No.: US 10,734,448 B2
(45) Date of Patent: Aug. 4, 2020

(54) CONVOLUTIONAL NEURAL NETWORK SYSTEM EMPLOYING RESISTANCE CHANGE MEMORY CELL ARRAY

(71) Applicant: Toshiba Memory Corporation, Minato-ku (JP)

(72) Inventor: Masaharu Wada, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/281,275

(22) Filed: Feb. 21, 2019

(65) Prior Publication Data

US 2020/0075677 A1 Mar. 5, 2020

(30) Foreign Application Priority Data

Aug. 28, 2018 (JP) ................. 2018-159344

(51) Int. Cl.
| | | |
|---|---|---|
| *G11C 13/00* | (2006.01) | |
| *H01L 27/24* | (2006.01) | |
| *G06N 3/063* | (2006.01) | |
| *G11C 8/14* | (2006.01) | |
| *G11C 7/18* | (2006.01) | |
| *G11C 11/54* | (2006.01) | |

(52) U.S. Cl.
CPC ......... *H01L 27/2481* (2013.01); *G06N 3/063* (2013.01); *G11C 7/18* (2013.01); *G11C 8/14* (2013.01); *G11C 11/54* (2013.01); *G11C 13/003* (2013.01); *G11C 13/0028* (2013.01); *G11C 13/0002* (2013.01)

(58) Field of Classification Search
CPC ....... G11C 13/0028; G11C 8/14; G11C 11/54; G06N 3/0481; H01L 27/2481
See application file for complete search history.

(56) References Cited

U.S. PATENT DOCUMENTS

| | | | | |
|---|---|---|---|---|
| 5,923,585 | A * | 7/1999 | Wong | G11C 16/12 365/185.03 |
| 9,542,621 | B2 | 1/2017 | He et al. | |
| 9,747,548 | B2 | 8/2017 | Ross et al. | |
| 2002/0181799 | A1* | 12/2002 | Matsugu | G06K 9/00281 382/260 |
| 2011/0292725 | A1 | 12/2011 | Choi et al. | |

(Continued)

FOREIGN PATENT DOCUMENTS

| | | |
|---|---|---|
| TW | 201209831 A1 | 3/2012 |
| TW | 201824092 A | 7/2018 |

*Primary Examiner* — Mushfique Siddique
(74) *Attorney, Agent, or Firm* — Oblon, McClelland, Maier & Neustadt, L.L.P.

(57) ABSTRACT

A semiconductor integrated circuit includes a cell array, an input unit and an output unit. Cell array includes word lines, bit lines and resistance change cells respectively formed at cross points between word lines and bit lines. Input unit includes an access controller and a driver. Access controller controls access of data to a cell in time series, the data being expressed by a matrix. Driver applies voltage to a word line coupled to the cell which is an access destination of the data, the voltage being adjusted depending on a value of the data to be accessed to the cell. The output unit includes holding circuits each holding a representative value of an output level of a corresponding one of the bit lines in time series.

7 Claims, 16 Drawing Sheets

(56) References Cited

U.S. PATENT DOCUMENTS

| | | | |
|---|---|---|---|
| 2015/0103581 A1* | 4/2015 | Murooka | G11C 13/0033 365/148 |
| 2016/0049195 A1* | 2/2016 | Yu | G11C 13/0026 365/63 |
| 2017/0084269 A1 | 3/2017 | Shi et al. | |
| 2018/0075339 A1* | 3/2018 | Ma | G06F 7/026 |
| 2018/0174025 A1* | 6/2018 | Jin | G06N 3/0481 |
| 2019/0035449 A1* | 1/2019 | Saida | G06N 3/084 |
| 2019/0080231 A1* | 3/2019 | Nestler | G06N 3/0454 |
| 2019/0114499 A1* | 4/2019 | Delaye | G06F 17/153 |
| 2019/0138892 A1* | 5/2019 | Kim | G06N 3/049 |
| 2019/0236445 A1* | 8/2019 | Das | G06N 3/04 |
| 2020/0035305 A1* | 1/2020 | Choi | G11C 7/16 |

* cited by examiner

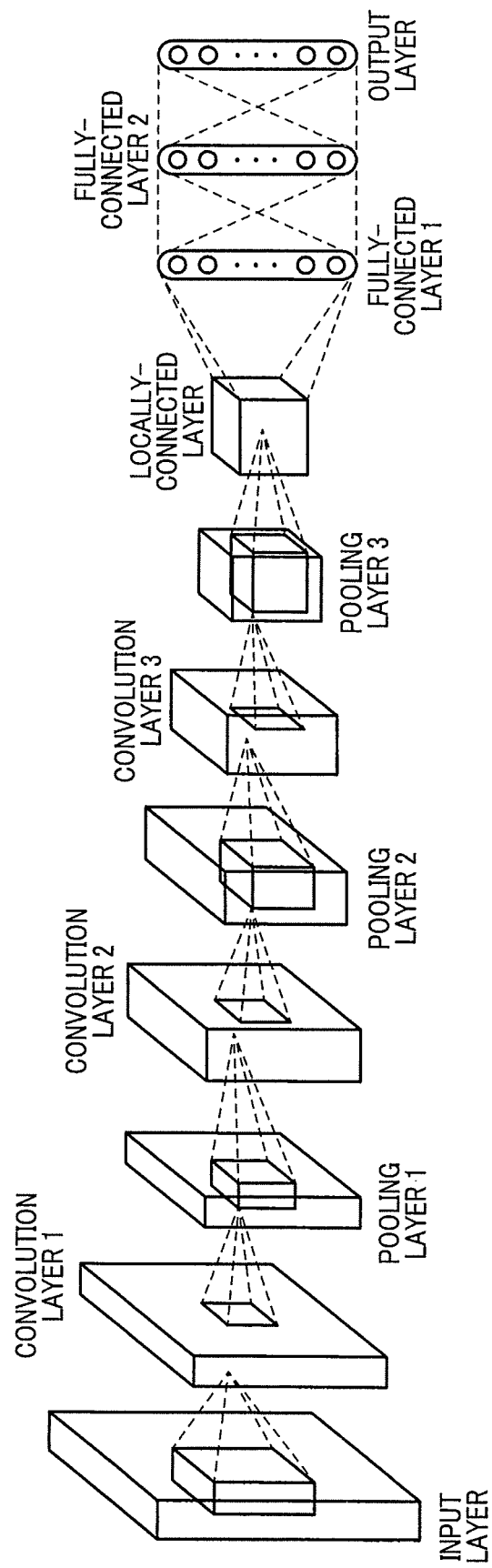
F I G. 1

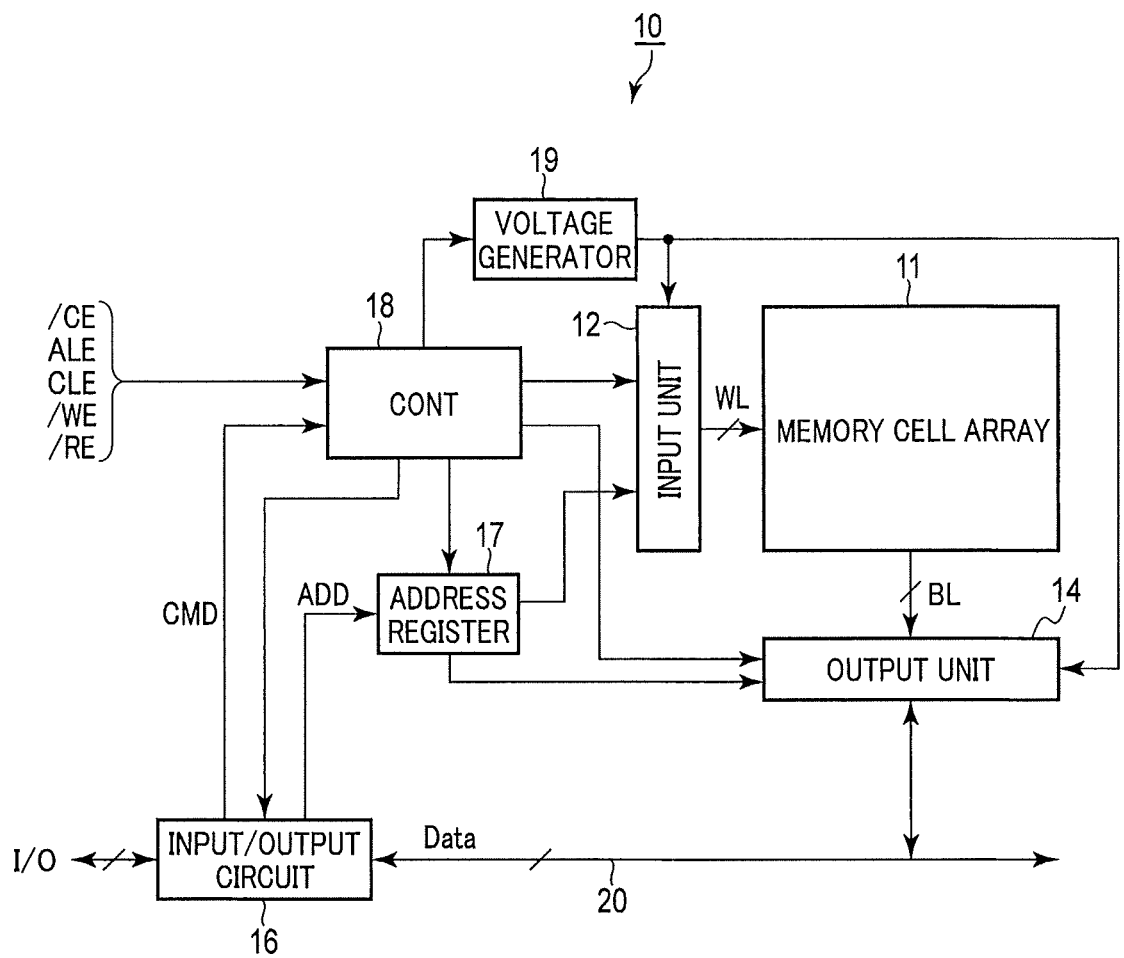
F I G. 4

| 0 | 6 | 12 | 18 | 24 | 30 |
|---|---|----|----|----|----|
| 1 | 7 | 13 | 19 | 25 | 31 |
| 2 | 8 | 14 | 20 | 26 | 32 |
| 3 | 9 | 15 | 21 | 27 | 33 |
| 4 | 10| 16 | 22 | 28 | 34 |
| 5 | 11| 17 | 23 | 29 | 35 |
F I G. 10
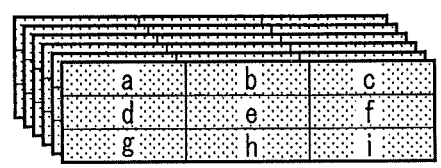
F I G. 11
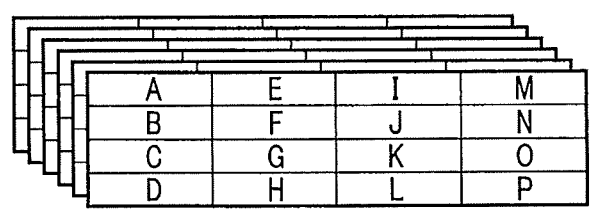
F I G. 12

FIG. 13

| 0 | 6 | 12 | 18 | 24 | 30 |
|---|---|---|---|---|---|
| 1 | 7 | 13 | 19 | 25 | 31 |
| 2 | 8 | 14 | 20 | 26 | 32 |
| 3 | 9 | 15 | 21 | 27 | 33 |
| 4 | 10 | 16 | 22 | 28 | 34 |
| 5 | 11 | 17 | 23 | 29 | 35 |

→ B

| 0 | 6 | 12 | 18 | 24 | 30 |
|---|---|---|---|---|---|
| 1 | 7 | 13 | 19 | 25 | 31 |
| 2 | 8 | 14 | 20 | 26 | 32 |
| 3 | 9 | 15 | 21 | 27 | 33 |
| 4 | 10 | 16 | 22 | 28 | 34 |
| 5 | 11 | 17 | 23 | 29 | 35 |

→ F

| 0 | 6 | 12 | 18 | 24 | 30 |
|---|---|---|---|---|---|
| 1 | 7 | 13 | 19 | 25 | 31 |
| 2 | 8 | 14 | 20 | 26 | 32 |
| 3 | 9 | 15 | 21 | 27 | 33 |
| 4 | 10 | 16 | 22 | 28 | 34 |
| 5 | 11 | 17 | 23 | 29 | 35 |

→ J

| 0 | 6 | 12 | 18 | 24 | 30 |
|---|---|---|---|---|---|
| 1 | 7 | 13 | 19 | 25 | 31 |
| 2 | 8 | 14 | 20 | 26 | 32 |
| 3 | 9 | 15 | 21 | 27 | 33 |
| 4 | 10 | 16 | 22 | 28 | 34 |
| 5 | 11 | 17 | 23 | 29 | 35 |

| 0 | 6 | 12 | 18 | 24 | 30 |
|---|---|----|----|----|----|
| 1 | 7 | 13 | 19 | 25 | 31 |
| 2 | 8 | 14 | 20 | 26 | 32 |
| 3 | 9 | 15 | 21 | 27 | 33 |
| 4 | 10 | 16 | 22 | 28 | 34 |
| 5 | 11 | 17 | 23 | 29 | 35 |

→ C

| 0 | 6 | 12 | 18 | 24 | 30 |
|---|---|----|----|----|----|
| 1 | 7 | 13 | 19 | 25 | 31 |
| 2 | 8 | 14 | 20 | 26 | 32 |
| 3 | 9 | 15 | 21 | 27 | 33 |
| 4 | 10 | 16 | 22 | 28 | 34 |
| 5 | 11 | 17 | 23 | 29 | 35 |

→ G

| 0 | 6 | 12 | 18 | 24 | 30 |
|---|---|----|----|----|----|
| 1 | 7 | 13 | 19 | 25 | 31 |
| 2 | 8 | 14 | 20 | 26 | 32 |
| 3 | 9 | 15 | 21 | 27 | 33 |
| 4 | 10 | 16 | 22 | 28 | 34 |
| 5 | 11 | 17 | 23 | 29 | 35 |

→ K

| 0 | 6 | 12 | 18 | 24 | 30 |
|---|---|----|----|----|----|
| 1 | 7 | 13 | 19 | 25 | 31 |
| 2 | 8 | 14 | 20 | 26 | 32 |
| 3 | 9 | 15 | 21 | 27 | 33 |
| 4 | 10 | 16 | 22 | 28 | 34 |
| 5 | 11 | 17 | 23 | 29 | 35 |

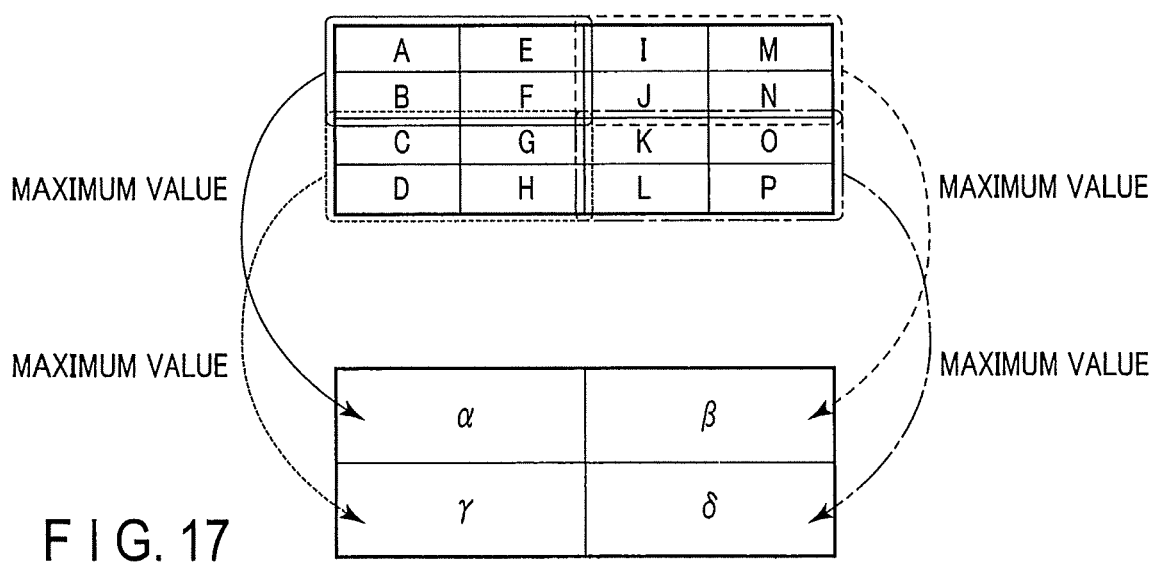
F I G. 16
F I G. 17

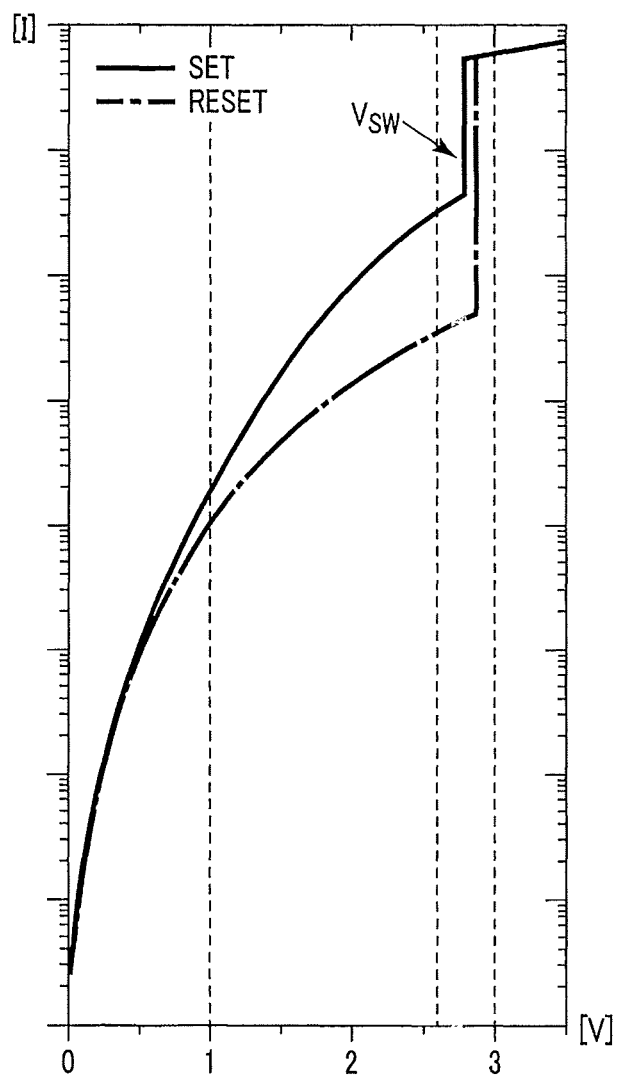
F I G. 21

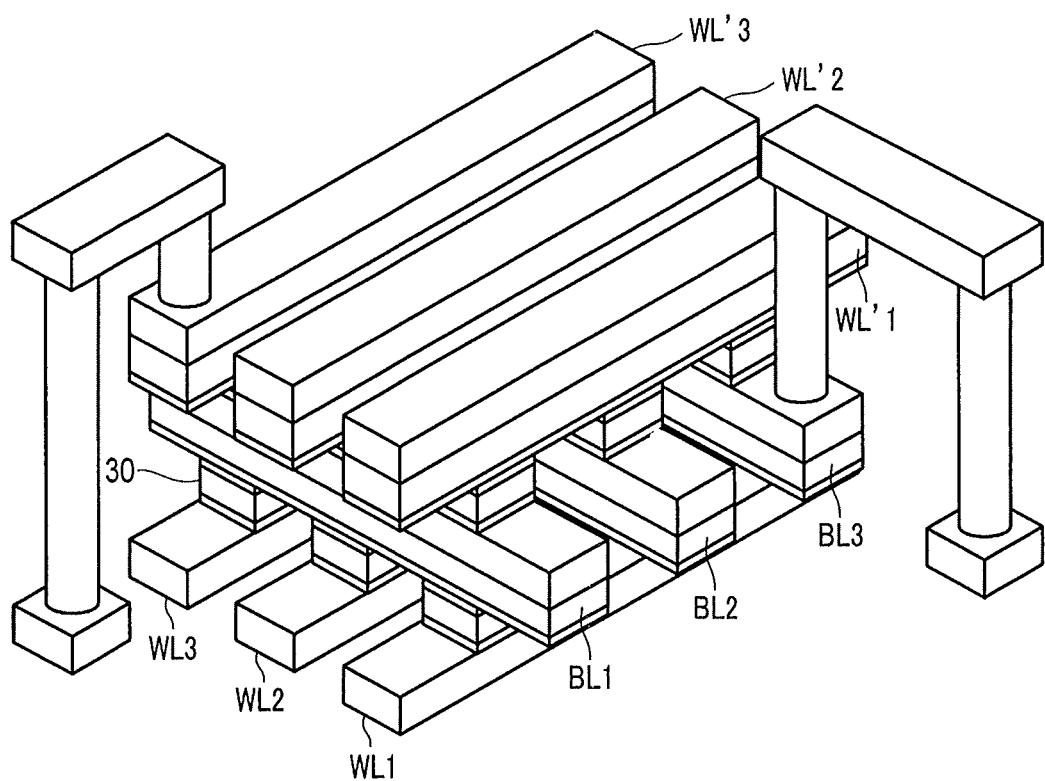
F I G. 22

CONVOLUTIONAL NEURAL NETWORK SYSTEM EMPLOYING RESISTANCE CHANGE MEMORY CELL ARRAY

CROSS-REFERENCE TO RELATED APPLICATIONS

This application is based upon and claims the benefit of priority from Japanese Patent Application No. 2018-159344, filed Aug. 28, 2018, the entire contents of which are incorporated herein by reference.

FIELD

Embodiments described herein relate generally to a semiconductor integrated circuit.

BACKGROUND

Technical development related to an artificial intelligence (AI) chip has been active. An AI chip can be considered to be a semiconductor integrated circuit having an arithmetic processing function based on AI technology. For example, a chip implemented with a neural network is also known.

A convolutional neural network (CNN), which is a kind of deep neural network (DNN) exerts an excellent performance especially in the field of image recognition processing. The CNN includes a convolution layer and a pooling layer.

The convolution layer extracts features of data of an immediately-preceding layer by a convolution operation using a filter (kernel) given by, for example, a square matrix. For example, if image data comprising a matrix of N rows×M columns is convoluted by a filter of 3×3, a feature vector (tensor) of (N−2) rows×(M−2) columns is calculated.

The pooling layer is, in short, provided for reducing the data size of the immediately-preceding layer. For example, the amount of data can be reduced by dividing an output of the convolution layer by a region of 2×2 to take a representative value within the region. Passing the maximum value within a region to the next layer is referred to as max pooling. It is theoretically possible to extract an average value or the minimum value within a region as a representative value.

BRIEF DESCRIPTION OF THE DRAWINGS

FIG. 1 is a conceptual diagram showing an example of a convolutional neural network;

FIG. 4 is a block diagram showing an example of a semiconductor integrated circuit according to the embodiment;

FIG. 10 is a diagram showing an example of input data assumed in the embodiment;

FIG. 11 is a diagram showing an example of a filter of a CNN assumed in the embodiment;

FIG. 12 is a diagram showing an example of an array storing a result of a convolution operation;

FIG. 13 is a diagram showing a relationship between an application region of a filter and array elements A, E, I, and M;

FIG. 14 is a diagram showing a relationship between an application region of a filter and array elements B, F, J, and N;

FIG. 15 is a diagram showing a relationship between an application region of a filter and array elements C, G, K, and O;

FIG. 16 is a diagram showing a relationship between an application region of a filter and array elements D, H, L, and P;

FIG. 17 is a diagram for explaining max pooling;

FIG. 21 is a graph showing an example of voltage-current characteristics of a diode Di as a selector; and FIG. 22 is a perspective view showing another example of a memory cell array.

DETAILED DESCRIPTION

Figure 2:
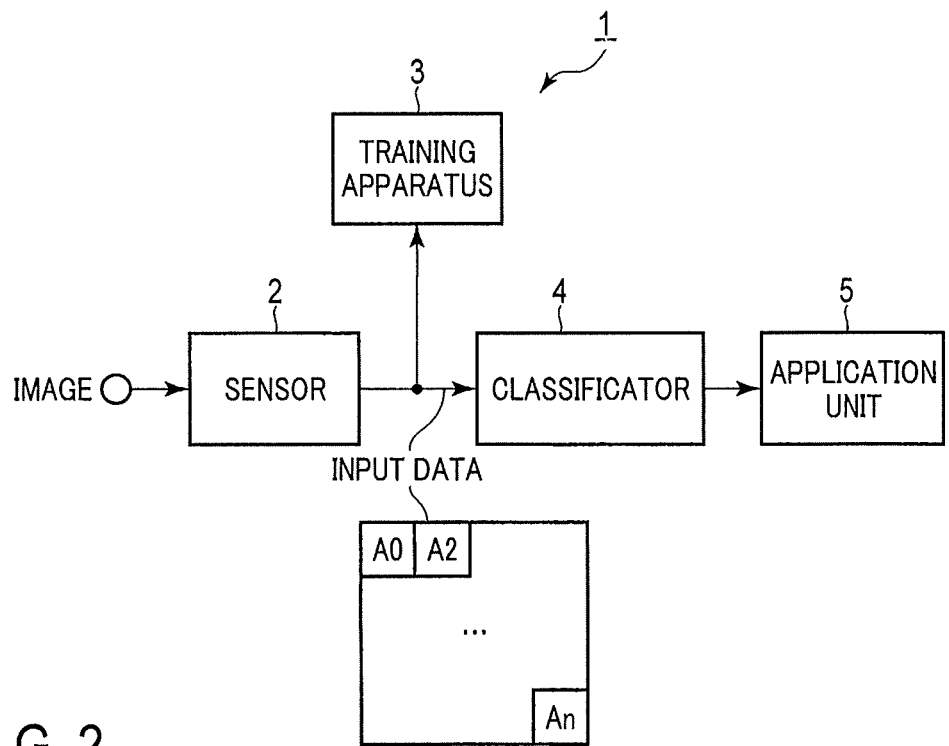
FIG. 2 is a block diagram showing an example of a classification system 1 according to an embodiment.

In general, according to one embodiment, a semiconductor integrated circuit includes a cross point type memory cell array, an input unit coupled to the memory cell array, and an output unit coupled to the memory cell array. The memory cell array includes a plurality of word lines, a plurality of bit lines crossing the word lines, and a plurality of resistance change memory cells respectively formed at cross points between the word lines and the bit lines. The input unit includes an access controller and a driver. The access controller controls access of data to a memory cell in time series, the data being expressed by a matrix. The driver applies an voltage to a word line coupled to the memory cell which is an access destination of the data, the voltage being adjusted depending on a value of the data to be accessed to the memory cell. The output unit includes a plurality of holding circuits. Each of the holding circuits holds a representative value of an output level of a corresponding one of the bit lines in time series.

Hereinafter, an embodiment will be described with reference to the drawings. Some embodiments described below exemplify apparatuses and methods for embodying the technical idea, and the technical idea is not specified by the shape, structure, arrangement, etc., of constituent components. Each of the function blocks can be implemented in the form of hardware, software, or a combination thereof. The function blocks do not have to be categorized as in the example described below. For example, part of the functions may be implemented by a function block other than the exemplary function blocks. In addition, the exemplary function blocks may be further divided into function sub-blocks. In the following description, elements having the same functions and configurations are denoted by the same reference numerals, and redundant explanations are given only when necessary.

Embodiment

[1] Outline

[1-1] Explanation of CNN

FIG. 1 is a conceptual diagram showing an example of a CNN. The CNN shown in FIG. 1 is configured by arranging a first convolution layer, a first pooling layer, a second convolution layer, a second pooling layer, a third convolution layer, a third pooling layer, a locally-connected layer, a fully-connected layer 1, and a fully-connected layer 2 in this order between an input layer and an output layer.

Data given from the input layer is passed to the first convolution layer, is subjected to a convolution operation based on a filter prepared in advance, and is then compressed in the immediately-subsequent first pooling layer. After repeating processing of this (convolution→pooling) as one unit over three times, through the locally-connected layer and the fully-connected layers 1 and 2, a feature value of the input data is outputted from the output layer.

A parameter (weight and/or bias) of a filter in each convolution layer is stored in a semiconductor integrated circuit as, for example, a trained model created in a cloud computing system (a cloud).

[1-2] Explanation of Application Example of CNN

A CNN can be used, for example, as a classificator for classifying a target captured in image data. A classification system is constructed by combining the classificator with a platform for making the classificator perform learning. In this embodiment, a classification system classifying any one of numbers 0 to 9 from image data will be described by way of example.

FIG. 2 is a block diagram showing an example of a classification system 1 according to the embodiment. The classification system 1 includes a sensor 2, a training apparatus 3, a classificator 4, and an application unit 5.

The sensor 2 is, for example, an image sensor, and outputs color or grayscale image data. This image data is given to the training apparatus 3 and the classificator 4 as input data. The input data is composed of (n+1) pixels, and a value of each pixel is expressed by Ak.

In the context of explaining a CNN, input data may be referred to as a feature map. Input data may be image data, or may be data passed from an immediately-preceding layer in a neural network. Input data (feature map) can be expressed by a matrix of the size of M×N. Each element of a matrix is a value of data which is an operation target. The value of data can be stored in an array of a M×N size obtained by one-dimensionally expanding a matrix.

The training apparatus 3 learns from multiple input data features thereof, and generates a weight coefficient in a CNN of the classificator 4. The training apparatus 3, for example, when image data obtained by sensing the number "5" is inputted, generates a weight coefficient such that "5" is outputted as a classification result. The training apparatus 3, for example, can be realized as a server computer in a cloud, or a service by a cloud, etc.

The classificator 4 acquires a weight coefficient of a CNN from the training apparatus 3. The classificator 4 applies input data to a CNN to which a weight coefficient is set to classify what a number drawn in an image is. The application unit 5 performs various processing by utilizing a classification result. A weight coefficient is repeatedly generated by the training apparatus 3. By updating the weight coefficient of the classificator 4 at each time, accuracy of classification can be improved.

Figure 3:
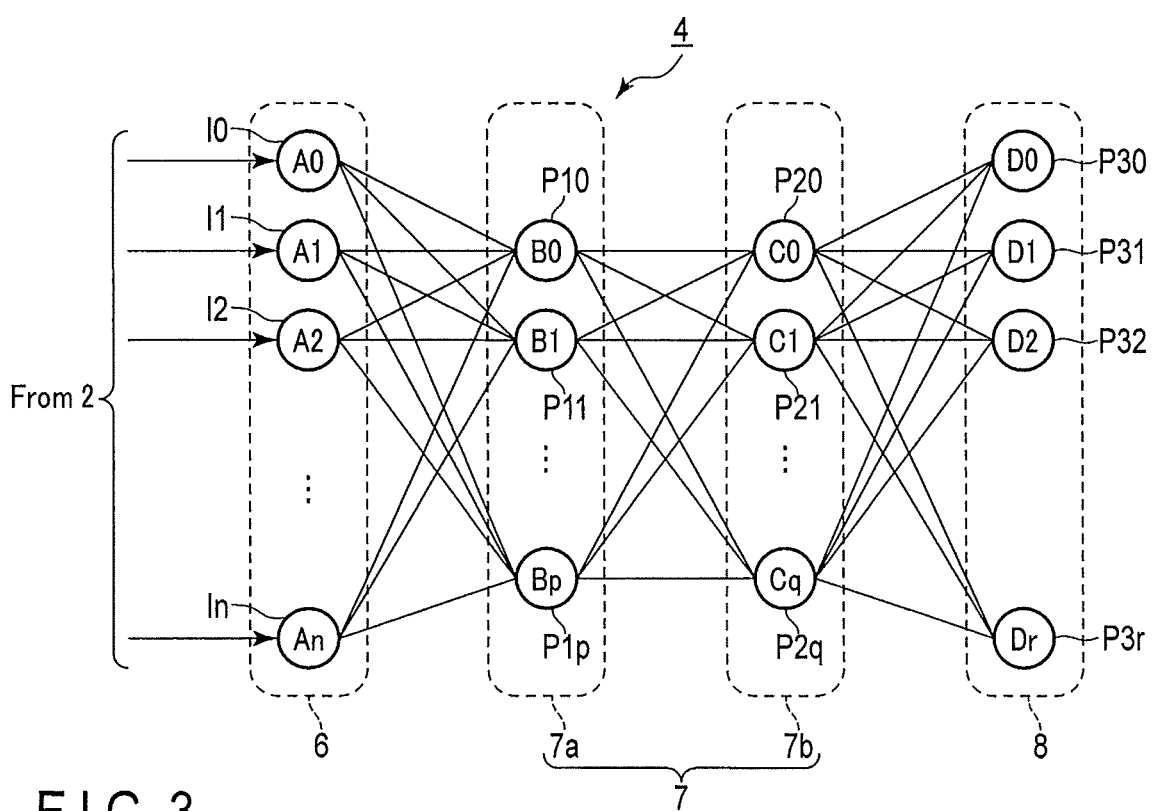
FIG. 3 is a conceptual diagram showing an example of a classificator 4 shown in FIG. 2.

FIG. 3 is a conceptual diagram showing an example of the classificator 4 shown in FIG. 2. The classificator 4 may be implemented by, for example, one or more semiconductor integrated circuits. The classificator 4 includes an input layer 6, one or more hidden layers 7, and an output layer 8. FIG. 3 shows an example in which the classificator 4 includes two layers; a hidden layer 7a and a hidden layer 7b. In this case, the hidden layer 7a can be considered to be a hidden layer of an initial stage. The hidden layer 7b can be considered to be a hidden layer continuous to the hidden layer 7a of the previous stage, and can be considered to be a hidden layer of the final stage.

The input layer 6 includes (n+1) nodes I0 to In. For example, a kth pixel value Ak in input data is set to a node Ik.

The hidden layer 7a includes (p+1) nodes P10 to P1p. p is a discretionary integer of 1 or more. Since operations of the nodes P10 to P1p are the same, a node P1k will be described as a representative in the following descriptions. To the node P1k, (n+1) pixel values A0 to An are inputted from the nodes I0 to In in the input layer 6. Then, the node P1k performs a convolution operation with the pixel values A0 to An and weight coefficients Fk0 to Fkn respectively corresponding thereto, and passes a result Bk to a next layer. The weight coefficients Fk0 to Fkn are acquired from the training apparatus 3.

The hidden layer 7b includes (q+1) nodes P20 to P2q. q is a discretionary integer of 1 or more. Since operations of the nodes P20 to P2q are the same, a node P2k will be described as a representative in the following descriptions. To the node P2k, (p+1) digital values B0 to Bp are inputted from the nodes P10 to P1p in the hidden layer 7a of the previous stage. Then, the node P2k performs a pooling operation with the digital values B0 to Bp and weight coefficients Gk0 to Gkp respectively corresponding thereto, and passes a result Ck to a next layer. The weight coefficients Gk0 to Gkp are acquired from the training apparatus 3.

The output layer 8 includes (r+1) nodes P30 to P3r, and performs an arithmetic operation on an output of the hidden layer 7b again to obtain an output. In this way, results of arithmetic operations over multiple layers are sequentially propagated until reaching the locally-connected layer (FIG. 1).

[2] Configuration

[2-1] Configuration of Semiconductor Integrated Circuit

FIG. 4 is a block diagram showing an example of a semiconductor integrated circuit according to this embodiment. A semiconductor integrated circuit 10 includes a cross point type memory cell array 11, an input unit 12, an output unit 14, an input/output circuit (I/O circuit) 16, an address register 17, a controller (CONT) 18, and a voltage generator 19.

The memory cell array 11 includes a plurality of word lines WL extending in a row direction, and a plurality of bit lines BL extending in a column direction crossing (e.g., orthogonal to) the row direction. At a position (cross point) where the word line WL and the bit line BL cross three-dimensionally, a memory cell MC is formed so as to couple the word line WL and the bit line BL. Each memory cell MC includes a ReRAM (Resistive Random Access Memory) element as a storage element. A specific configuration of the memory cell MC will be described later.

The input unit 12 is coupled to a plurality of word lines WL of the memory cell array 11. The input unit 12 includes, for example, a driver driving the word lines WL. The input unit 12 decodes a row address acquired from the address register 17, and selects the word line WL based on a decoding signal (row selection signal). A specific configuration of the input unit 12 will be described later.

The output unit 14 is coupled to a plurality of bit lines BL of the memory cell array 11. The output unit 14 includes a read circuit (sense amplifier), etc., and extracts an output signal (Data) from each bit line BL and sends the output signal to the input/output circuit 16. A specific configuration of the output unit 14 will be described later.

The input/output circuit 16 is coupled to an external device via an input/output terminal I/O. The input/output circuit 16 performs passing of data with the external device. Passing of data between the input/output circuit 16 and the output unit 14 is performed via a bidirectional data bus 20.

The controller 18 controls an operation of the semiconductor integrated circuit 10. The controller 18, for example, receives external control signals, such as a chip enabling signal/CE, an address latch enabling signal ALE, a command latch enabling signal CLE, a write enabling signal/WE, and a read enabling signal/RE, etc. from an external device (a host controller, etc.). "/" modifying the signal name represents active low.

The controller 18 classifies an address ADD and a command CMD supplied from the input/output terminal I/O based on these external control signals. Then, the controller 18 sends the address ADD to the input unit 12 and the output unit 14 via the address register 17. In addition, the controller 18 decodes the command CMD. The controller 18 performs a sequence control related to each of data reading, data writing, and data erasing in accordance with the external control signals and the command.

The voltage generator 19 generates an internal voltage (e.g., including a voltage boosted higher than a power supply voltage) needed for each operation. The voltage generator 19 is controlled by the controller 18, and generates a necessary voltage.

[2-2] Configurations of Input Unit 12 and Output Unit 14

Figure 5:
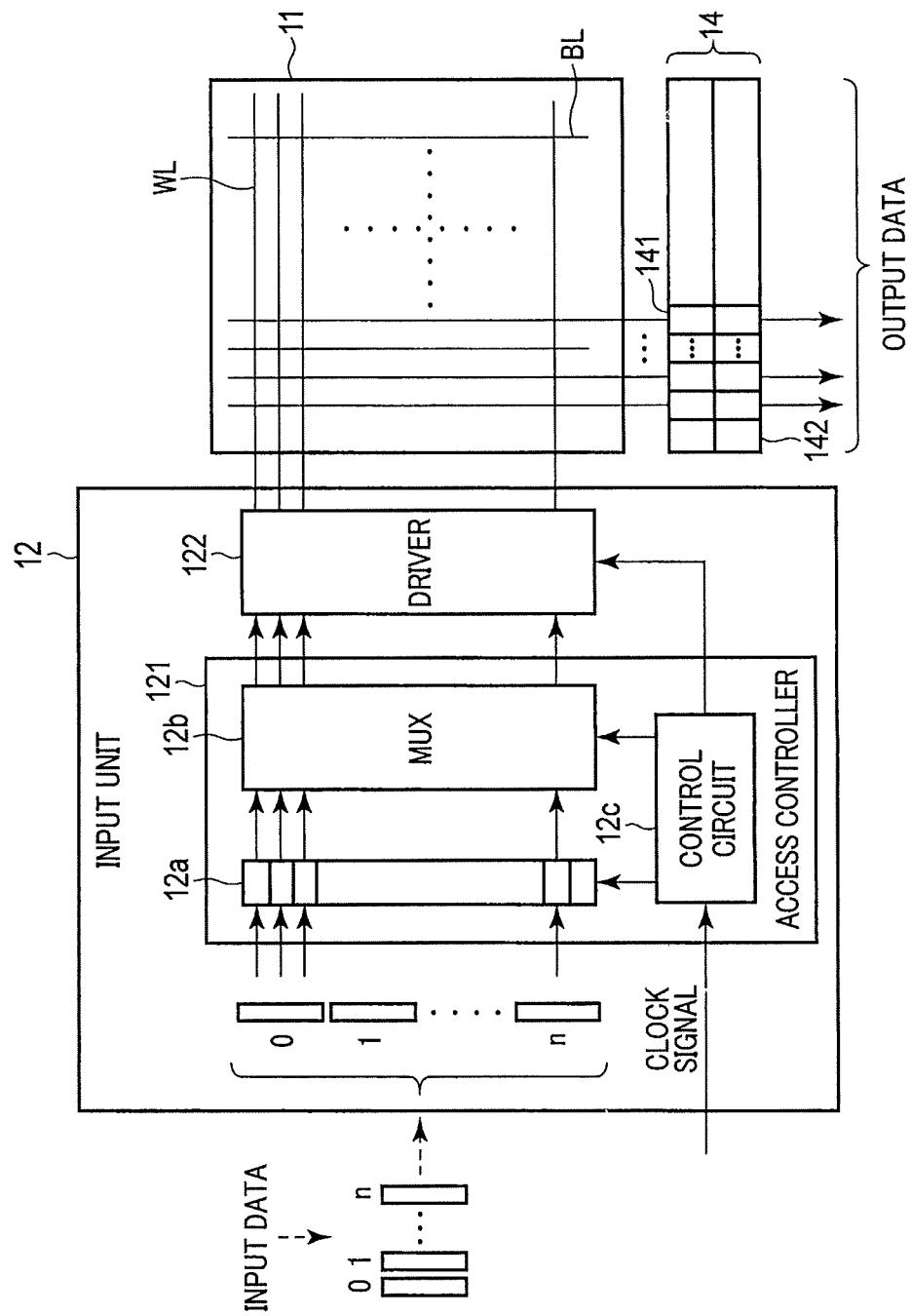
FIG. 5 is a block diagram showing an example of an input unit 12 and an output unit 14 shown in FIG. 4.

FIG. 5 is a block diagram showing an example of the input unit 12 and the output unit 14 shown in FIG. 4. The input unit 12 includes an access controller 121 and a driver 122.

The access controller 121 controls access of input data to the memory cell MC based on a clock signal in time series. Namely, the access controller 121 switches a correspondence between a value of a matrix element representing input data with the memory cell MC based on a clock signal in a time division manner.

The driver 122 applies to a word line WL coupled to a memory cell MC to be an access destination of each input data, a voltage according to a value of the data. Namely, the driver 122 applies to a word line WL coupled to a memory cell MC corresponding to a value of a matrix element, a voltage according to the value.

In FIG. 5, for example, input data expressed by (n+1) rows of 0 to n is expanded into a one-dimensional array, and is inputted to the access controller 121 of the input unit 12. The access controller 121 includes a shift register 12a as a shift circuit, a MUX (Multiplexer) 12b as a selection circuit, and a control circuit 12c controlling these circuits based on a clock signal.

The shift register 12a temporarily stores input data. Then, input data is shifted to a shift amount and a shift direction given from the control circuit 12c, and is stored in the MUX 12b. The MUX 12b couples the shifted input data to the driver 122.

The MUX 12b selectively couples the data shifted by the shift register 12a to the driver 122. By providing the MUX 12b, a shift amount of data can be given with the small number of clocks. If the number of clocks required for data shifting can be a large number, the MUX 12b may be omitted.

Herein, the control circuit 12c controls a shift amount and a shift direction of the shift register 12a in time series based on a size and a stride of a filter used in a CNN to be implemented in the memory cell array 11 and a size of a matrix representing input data. As already known to a person with ordinary skill in the art, an interval of a position to apply a filter is referred to as a stride. In addition, a size of a matrix of M rows and N columns is expressed by (M×N). In a case of considering data padding, the size of a matrix is larger than this, e.g., (M+2)×(N+2).

When a voltage is applied to some word lines WL by a driver, a current according to a resistance value of the memory cell MC of a cross point flows in a bit line crossing the word lines WL. A representative value of an output level of the current is held by the holding circuit of the output unit 14.

The holding circuit is, for example, formed by coupling a conversion circuit 141 and a peak hold circuit 142 in series, and is formed at an output stage of each of the bit lines BL. The conversion circuit 141 converts a current flowing in the coupled bit line BL into a voltage. The peak hold circuit 142 holds a peak value of an output voltage of the conversion circuit 141, and holds the peak value as output data. A comparison circuit that compares the held peak value with a reference voltage to binarize and output it may be provided for each bit line BL.

[2-3] Configuration of Memory Cell Array 11

Figure 6:
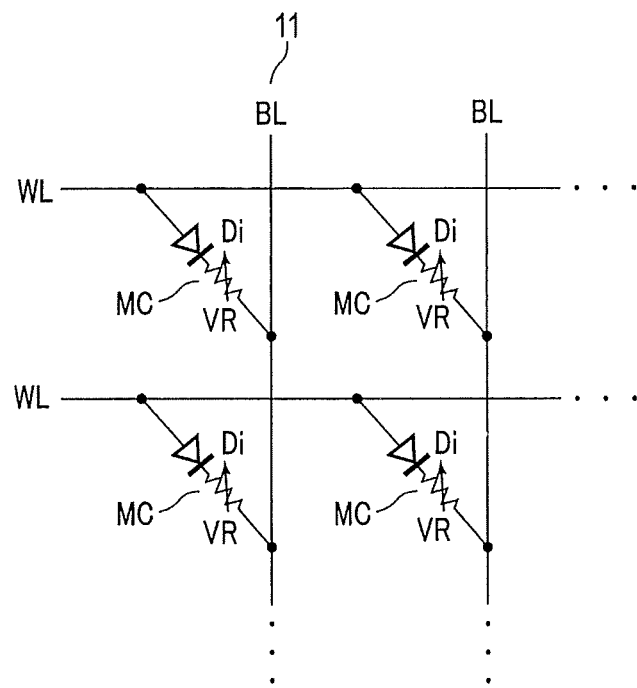
FIG. 6 is a diagram showing an example of an equivalent circuit of a memory cell array 11.

FIG. 6 is a diagram showing an example of an equivalent circuit of the memory cell array 11. In the memory cell array 11, a memory cell MC is formed at each of cross points of the word lines WL and the bit lines BL. Each memory cell MC is so-called a two-terminal resistance change memory, and is formed by coupling a variable resistance element VR and a bipolar diode Di in series.

The resistance change memory can store analog information. Each memory cell MC stores a resistance value corresponding to a weight of a filter of a CNN in the variable resistance element VR. More specifically, a reciprocal of a resistance value corresponds to a weight of a filter in the embodiment.

The diode Di is provided to suppress a sneak current to a peripheral cell in a write operation to the memory cell MC. This kind of element is known as a selector. In a cross point structure, there is a concern that a reverse bias may be applied also to a non-selected memory cell in a write operation to a selected memory cell. Accordingly, by coupling a selector to a storage medium (variable resistance element) in series, a sneak current due to the reverse bias is suppressed. In the embodiment, a bipolar diode Di is described as an example of a selector; however, the configuration is not limited thereto. As a selector, various kinds of elements that are substantially turned on or off according to whether a voltage between two terminals is higher or lower than a threshold value can be used. For example, even by using a switch (e.g., Ovonic Threshold Switch) utilizing the ovonic effect as a selector, the same effect can be obtained.

Figure 7:
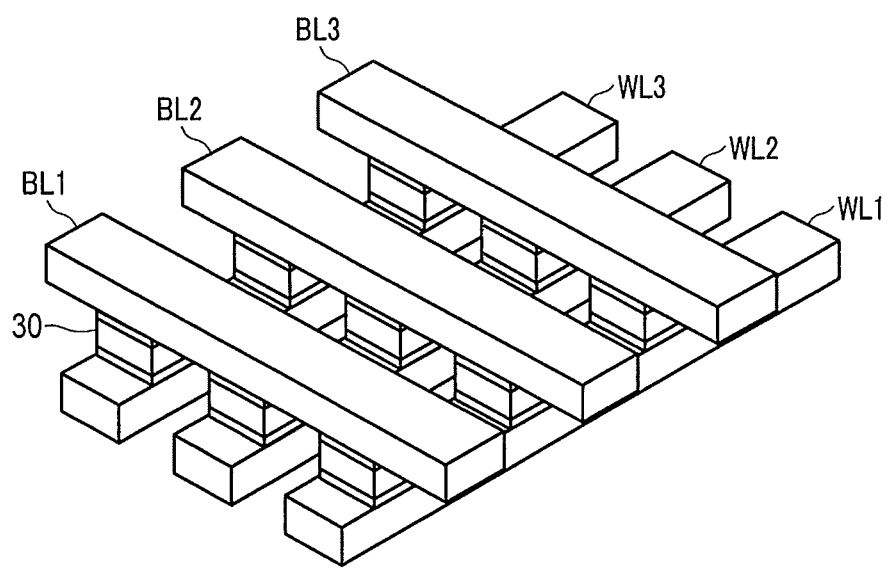
FIG. 7 is a perspective view of the memory cell array 11.

FIG. 7 is a perspective view of the memory cell array 11. In FIG. 7, a plurality of bit lines BL (BL1, BL2, . . . ) are arranged in parallel to one another. A plurality of word lines WL (WL1, WL2, . . . ) are arranged in parallel to one another. The word lines WL are orthogonal to the bit lines BL. Then, a memory element 30 is formed at each cross point between the bit lines BL and the word lines WL.

Figure 8:
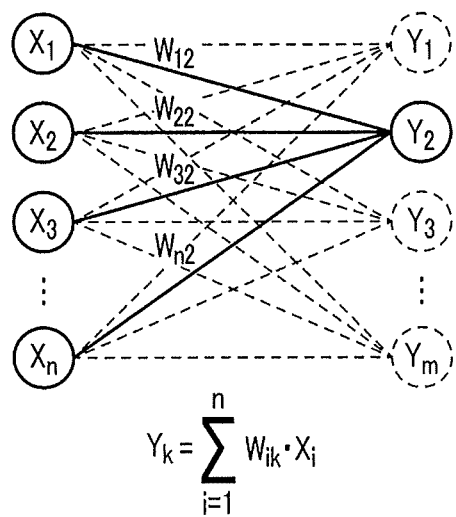
FIG. 8 is a conceptual diagram showing a product-sum operation in a neural network.

FIG. 8 is a conceptual diagram showing a product-sum operation in a neural network. When a product-sum operation (convolution) is performed by, for example, weights W12 to Wn2 for input data respectively having values $X_1$ to $X_n$, input data $Y_2$ is obtained.

Figure 9:
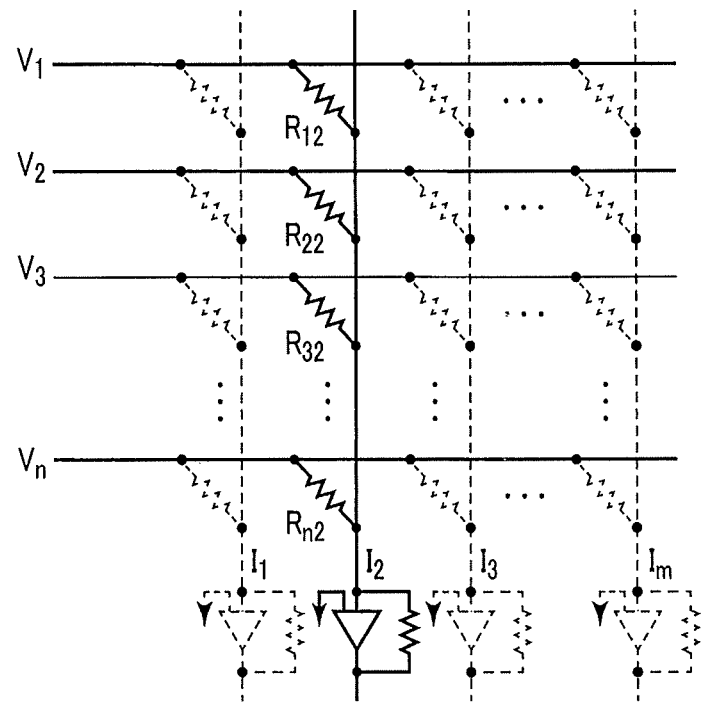
FIG. 9 is a diagram for explaining a product-sum operation by a cross point type memory cell array.

FIG. 9 is a diagram for explaining a product-sum operation by a cross point type memory cell array. For example, when the word lines WL are driven by voltage values $V_1$ to $V_n$ respectively, a current proportional to a reciprocal of a resistance value of a memory cell MC is generated for each cross point. The current generated at each cross point is a product of a reciprocal of a resistance value and a voltage value, and its total sum is extracted from the bit lines BL. When comparing a formula indicating a current value with a formula of FIG. 8, they have the same form. Namely, if a memory cell array that stores a reciprocal of a weight as a resistance value in a memory cell is used, by multiple selection of data and current addition, a product-sum operation of a signal can be implemented. In this way, if a memory cell array of a cross point structure is used, a CNN can be implemented in a hardware circuit in a natural form. Next, a working effect in the above configuration will be described.

[3] Working Effect

FIG. 10 is a diagram showing an example of input data assumed in the embodiment. To make the description simple, image data indicated by a square matrix of six rows and columns is assumed; however, the size is not limited thereto, and is not limited to a square matrix. A value of each element of the matrix indicates, for example, a brightness value of each pixel of image data.

FIG. 11 is a diagram showing an example of a filter of a CNN assumed in the embodiment. By using a plurality of filters, a plurality of feature values can be extracted. In FIG. 11, six kinds (six channels) of filters are used; however, the number of filters is not limited thereto. Matrix elements representing the filter are indicated by (a, b, c, d, e, f, g, h, and i).

FIG. 12 is a diagram showing an example of an array storing a result of a convolution operation. For example, if data of FIG. 10 is given to an input layer (FIG. 1) of a CNN, a result of a product-sum operation in the first convolution layer is stored in each of the array elements A to P of FIG. 12. When a matrix of 6×6 size is convoluted by a filter of 3×3 size, an output of 4×4 size can be obtained in a case where padding is not considered.

FIGS. 13 to 16 are diagrams each showing a relationship between an application region of a filter for input data and each of the array elements A to P of FIG. 12. The array element A stores a result of a product-sum operation of the filter (a, b, c, d, e, f, g, h, and i) and an upper-left portion (hatching portion) (0, 6, 12, 1, 7, 13, 2, 8, and 14) of the input data matrix. Similarly, a hatching portion of each drawing is associated with each of the array elements B to P.

In the examples of FIGS. 13 to 16, a procedure of performing a convolution operation of 3×3 at a stride 1 is shown. As an application portion of a filter is moved in a process of a CNN operation, it can be understood that data related to a product-sum operation has periodicity.

FIG. 17 is a diagram for explaining max pooling. By dividing sixteen array elements A to P into, for example, a 2×2 region to take the maximum value of each region, a 2×2 matrix (α, β, γ, δ) can be obtained. For example, a is the maximum value among A, B, E, and F. FIG. 17 shows an example in which max pooling of 2×2 is performed at a stride 2.

Figure 18:
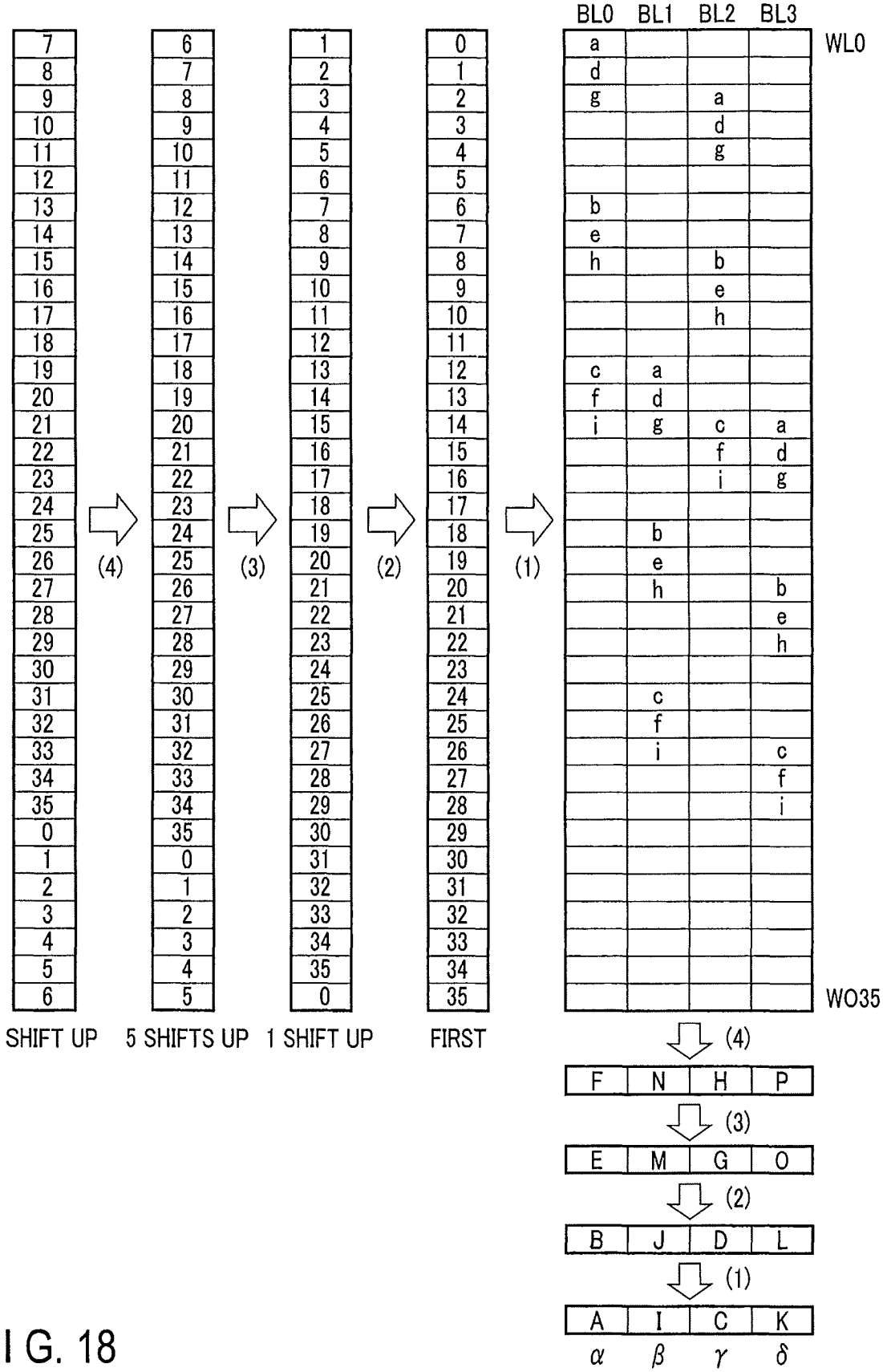
FIG. 18 is a diagram for explaining a working effect according to the embodiment.

FIG. 18 is a drawing for explaining a working effect in the embodiment. With reference to a timing chart of FIG. 19 as well, a working effect in the embodiment will be described. In this embodiment, a CNN in which a calculation is performed under the condition that "a convolution operation at the stride 1 is performed by a (3×3) filter on input data expressed by a (6×6) matrix, and max pooling at the stride 2 is performed in a 2×2 region" is raised as an example.

As shown in FIG. 18, under the above condition, a memory cell array includes a 36×4 matrix structure. Namely, 36 word lines (WO0 to WL35) and 4 bit lines (BL0 to BL3) are consumed. With i and j as indices, a memory cell at an intersection of a word line WLi and a bit line BLj is expressed by (WLi, BLj).

Filter values a, b, c, d, e, f, g, h, and i are periodically stored in each memory cell. For example, the value a is stored in memory cells (WL0, BL0), (WL12, BL1), (WL2, BL2), and (WL14, BL3). Similarly, the other values b, c, d, e, f, g, h, and i are each stored in four memory cells.

An array of data expanded one-dimensionally is input to the memory cell array 11 storing a weight. At the first step (1) corresponding to an address A1 (FIG. 19), data 0 is assigned to the memory cell (WL0, BL0), and data 1 to data 35 are sequentially assigned in a direction in which the index i of the word line increases.

According to this, the driver 122 applies a voltage according to a data value to each word line. At this time, a current corresponding to a resistance value flows in the memory cells storing the values a, b, c, d, e, f, g, h, and i. Then, a result of adding the current is outputted as a result of a product-sum operation from each bit line BL. Although a minute current flows in a memory cell (corresponding to a blank matrix: a resistance value is maximum (insulation state)) in which a weight is not stored, a value thereof is negligible. Thus, an effect brought about by a memory cell, in which a weight is not stored, on a result of the operation can be neglected.

Figure 19:
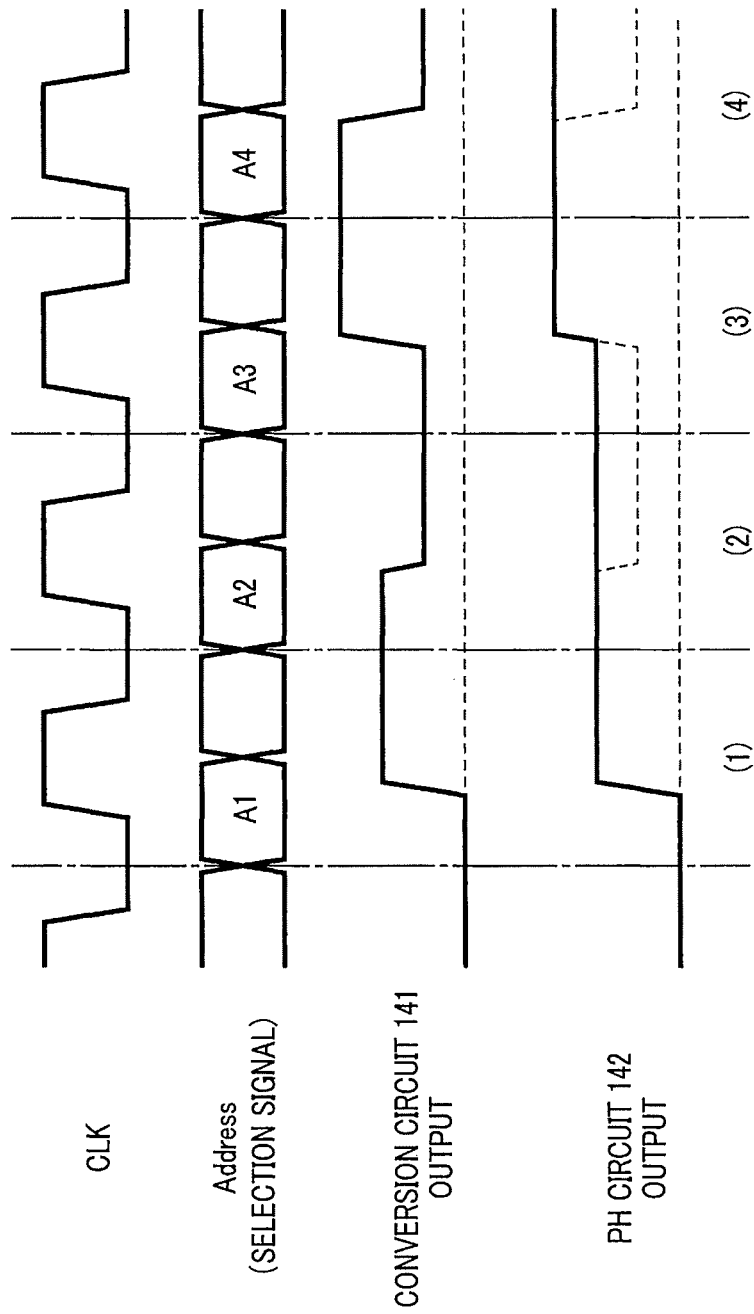
FIG. 19 is a timing chart for explaining a working effect according to the embodiment.

At step (1), results corresponding to A, I, C, and K of FIG. 12 are obtained, and an output of the conversion circuit 141 is held in the peak hold (PH) circuit 142 as shown in FIG. 19.

The next address A2 is given in synchronization with a clock signal (CLK) of FIG. 19, and at step (2), data is shifted one in an upper direction by the shift register 12a. A shift amount herein is set based on a size and a stride of a filter and a size of a data matrix.

The upper direction indicates a shift from a state in which data 0 is assigned to the memory cell (WL0, BL0) in FIG. 18 to a state in which data 1 is assigned thereto. By causing the shift register 12a to act in this way, a state in which the filter is slid to a hatching region for obtaining [B] of FIG. 14 is realized on the bit line BL0. Namely, data (1, 2, 3), (7, 8, 9), and (13, 14, 15) are assigned to (a, d, g), (b, e, h), and (c, f, i) of the filter, respectively. According to this, a voltage is applied to each word line by the driver 122, and a result of adding generated currents is outputted from each bit line BL.

States for obtaining [J], [D], and [L] are also simultaneously created in the bit lines BL1, BL2, and BL3, respectively. Thus, at step (2), results corresponding to B, J, D, and L of FIG. 12 are obtained. In FIG. 19, even when an output of the conversion circuit 141 is lowered, for example, an output of the peak hold (PH) circuit 142 is held in the state of (1).

Furthermore, if the next address A3 is given, at step (3), data is shifted five in the upper direction by the shift register 12a. A shift amount herein is set based on the size and the stride of the filter and the size of the data matrix. With only the shift register 12a, 5 clocks are consumed, but by combining the MUX 12b, a data array can be shifted for five blocks by one clock.

Figure 13:
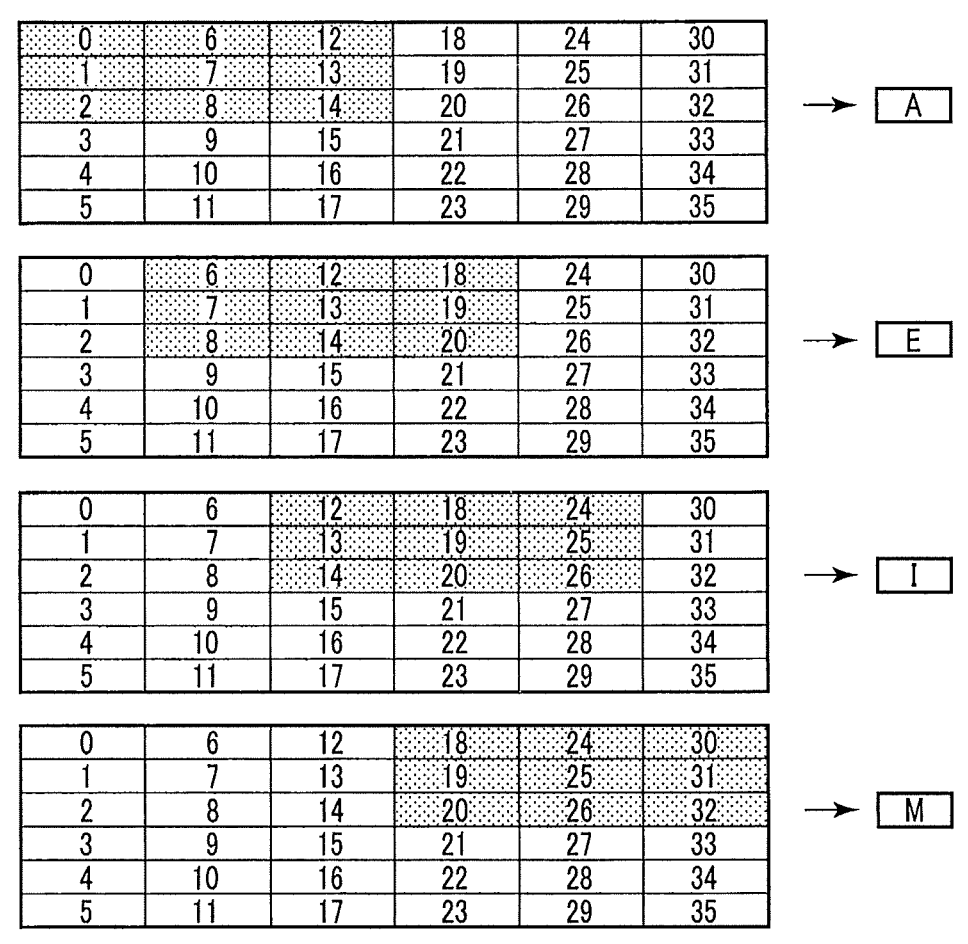

Accordingly, a state in which the filter is slid to a hatching region for obtaining [E] of FIG. 13 is realized by the bit line BL0. Namely, data (6, 7, 8), (12, 13, 14), and (8, 19, 20) are assigned to (a, d, g), (b, e, h), and (c, f, i) of the filter, respectively. According to this, a voltage is applied to each word line by the driver 122, and a result of adding generated currents is outputted from each bit line BL.

States for obtaining [M], [G], and [O] are also simultaneously created in the bit lines BL1, BL2, and BL3, respectively. Thus, at step (3), results corresponding to E, M, G, and O of FIG. 12 are obtained. In FIG. 19, if an output of the conversion circuit 141 increases, an output of the peak hold (PH) circuit 142 also increases.

If the next address A4 is given, at step (4), data is shifted up one by the shift register 12a. A shift amount herein is also set based on the size and the stride of the filter and the size of the data matrix.

Accordingly, a state in which a filter is slid to a hatching region for obtaining [F] of FIG. 14 is realized by the bit line BL0. Namely, data (7, 8, 9), (13, 14, 15), and (19, 20, 21) are assigned to (a, d, g), (b, e, h), and (c, f, i) of the filter, respectively. According to this, a voltage is applied to each word line by the driver 122, and a result of adding generated currents is outputted from each bit line BL.

States for obtaining [N], [H], and [P] are also simultaneously created in the bit lines BL1, BL2, and BL3, respectively. Thus, at step (4), results corresponding to F, N, H, and P of FIG. 12 are obtained. In FIG. 19, even when an output of the conversion circuit 141 is lowered, for example, an output of the peak hold (PH) circuit 142 is held in the state of (3).

[4] Advantageous Effects

A semiconductor integrated circuit according to an embodiment includes a memory cell array including a plurality of memory cells, a MUX and a shift register controlling signal coupling to the memory cell array, a conversion circuit processing an output of the memory cell array, and a peak hold circuit holding the maximum value of the output. Then, a weight of a CNN is stored in individual memory cells, a convolution operation is performed by controlling an access to a memory cell by the MUX and the shift register, and the maximum value of the output of the memory cell array is detected by the peak hold circuit so as to perform max pooling processing.

In the embodiment, a CNN that "a convolution operation at the stride 1 is performed by a (3×3) filter on input data expressed by a (6×6) matrix, and max pooling at the stride 2 is performed in a 2×2 region" is implemented in the semiconductor integrated circuit. Namely, a weight of a filter is stored in a memory cell array of a 36×4 matrix structure as a reciprocal of a resistance value. In addition, a voltage according to data is applied to a word line, a sum of current generated in a memory cell is extracted from a bit line, and the sum is converted into a voltage so as to retain the maximum value thereof. Furthermore, data expanded one-dimensionally is shifted by the shift register 12a so that the same arithmetic operation as sliding a filter can be performed. A peak value is retained by the peak hold circuit 142 so that a voltage value indicating the same result as that of max pooling can be obtained.

Figure 20:
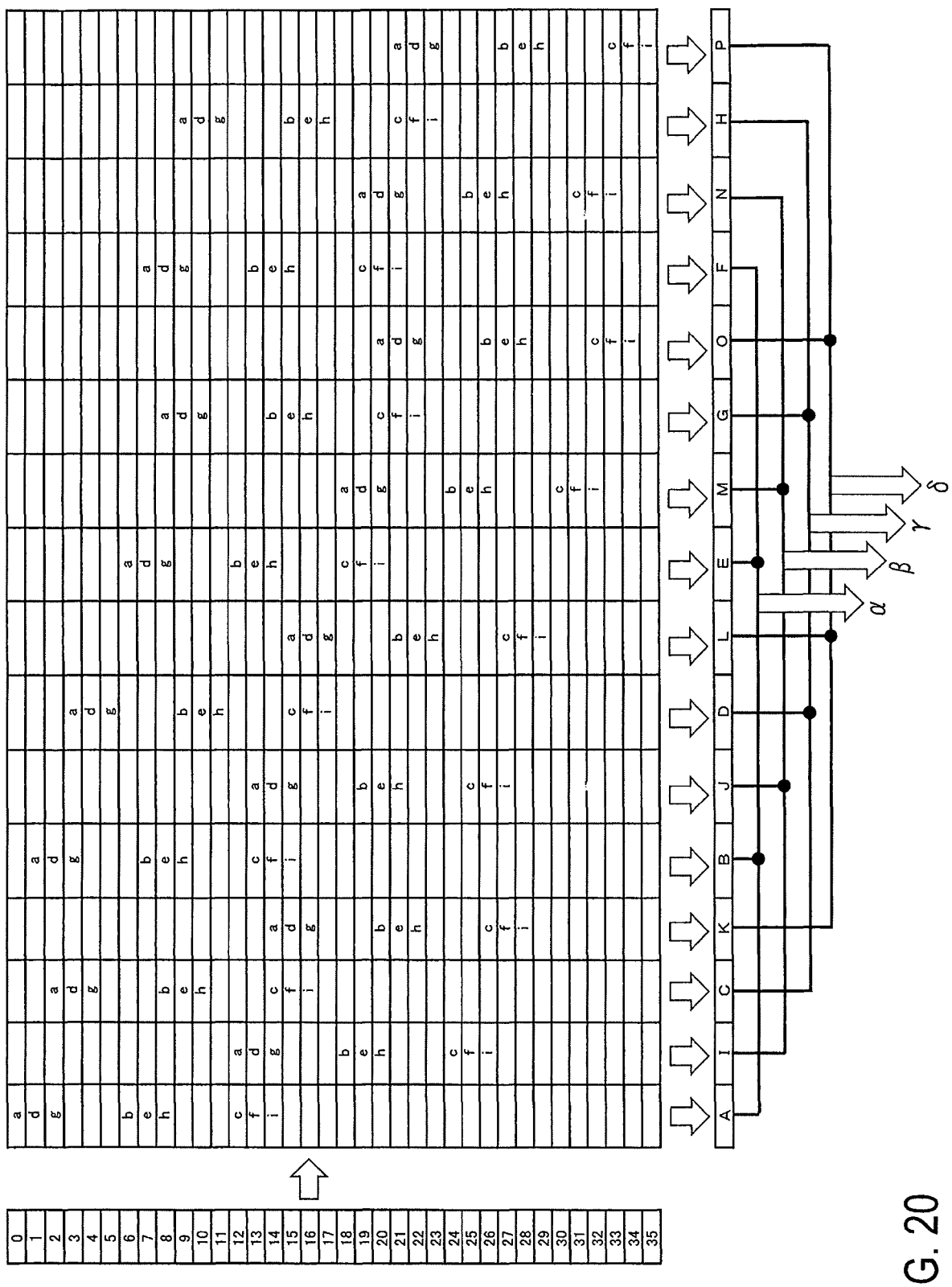
FIG. 20 is a diagram showing a memory region consumed in an existing neural network for comparison.

FIG. 20 is a schematic diagram showing an existing semiconductor integrated circuit for comparison. The existing circuit does not include a shift register shifting a data array, and the control circuit 12c controlling a shift amount and a shift direction thereof. Thus, there is no motivation to provide a peak hold circuit. It is thus necessary to select the maximum value of an output of a bit line for max pooling processing. In addition, it is also necessary to separately prepare memory spaces for processing for CNN and for max pooling, which would consume a corresponding amount of memory space therefor.

In the first place, sixteen bit lines would be needed in case a result after the convolution operation may become a matrix of a 4×4 size. Thus, as compared with FIG. 18, four times more memory regions would be consumed. In a real CNN using mass data and a filter of a large size, the amount of memory consumed would be even higher. Furthermore, if the number of channels of a filter increases, the amount of memory consumed is further doubled in accordance with such number of channels.

When implementing a neural network in a semiconductor chip, a large amount of memory space for storing, for example, a filter of a CNN is consumed. Additionally, a buffer memory for temporarily storing a result of a convolution operation or a result of a pooling operation is needed, which further suppresses the amount of memory space. If the number of convolution layers and pooling layers increases, the situation would get worse.

In the embodiment, in contrast, by shifting data inputted into the memory cell array in time series, the memory capacity can be remarkably reduced. In addition, since a result of a product-sum operation can be obtained as an addition value of currents in time series, max pooling can be implemented merely by converting it into a voltage and retaining the maximum value, thereby further simplifying the circuit.

Thus, according to this embodiment, it is possible to provide a semiconductor integrated circuit capable of implementing a neural network in a memory-saving manner. In addition, since a memory space can be saved, cost saving can be expected. Furthermore, for the memory space saved, resources can be distributed to other arithmetic operations, and speeding up can also be encouraged.

[5] Modifications

[5-1] Modification Related to Drive Voltage of Memory Cell

FIG. 21 is a graph showing an example of a voltage-current characteristic of the diode Di (FIG. 6) as a selector. The horizontal axis indicates voltage, and the vertical axis indicates current (logarithm). In the figure, $V_{sw}$ indicates a voltage by which a selector is turned on, and in a normal memory cell array, a memory cell is driven in a voltage region of $V_{sw}$ or more.

However, in this modification, conversely, it is preferable to drive a memory cell in a voltage region of $V_{sw}$ or less. The reason therefor will be explained in the following.

Namely, in the modification, since an addition value of currents generated in each memory cell is extracted as a result of a product-sum operation, it is preferable to suppress a current value in individual memory cells as low as possible in order to suppress an energy load especially on an output side. As the number of memory cells increases, this tendency increases. For such a reason, in the modification, the memory cells are driven in the voltage region of $V_{sw}$ or less which corresponds to an off region of the selector.

It is anticipated that it would become difficult to maintain the accuracy due to lowering the voltage. However, in the field in which a CNN is applied, there are not many applications requiring high accuracy. There is such a strong tendency in the fields of image processing and image recognition, for example. Under such a circumstance, there is a huge merit in driving the memory cells in the off region of the selector and using the memory cells in a region where an output from the selector has a small current.

[5-2] Modification Related to Drive Voltage of Memory Cell

FIG. 22 is a perspective view showing another example of a memory cell array, showing a memory cell array having a structure of including a layer of bit lines BL (BL1, BL2, . . . ) and two layers of word lines WL (WL1, WL2, WL' (WL'1, WL'2, . . . ) sandwiching the bit lines from above and below. An application in which one of the two layers of word lines corresponds to a sign (+), and the other corresponds to a sign (−) can be considered. By doing so, treating data having positive value and data having negative value can be implemented simply.

In the above each embodiment, the configuration shown in FIG. 1 is applied as a CNN. However, the CNN is not limited to the configuration shown in FIG. 1, and a total-binding type multi-layered neural network may be applied. In addition, the total number of layers, the number of convolution layers, and the number of pooling layers, etc. can also be designed freely according to system requirements.

In the above each embodiment, as a semiconductor memory device, a ReRAM using a variable resistance element is described by way of example. However, the above each embodiment is not limited thereto, and is applicable to a resistance change memory similar to the ReRAM, e.g., a MRAM (Magnetic Random Access Memory), a PCRAM (Phase-Change Random Access Memory), etc.

Moreover, the configuration of memory cell array is not limited to the one shown in the drawings, and the above each embodiment is applicable to a memory cell array configured to include a bit line (so-called vertical bit line) arranged perpendicularly to a word line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a cross point type memory cell array;
an input unit coupled to the memory cell array; and
an output unit coupled to the memory cell array,
wherein the memory cell array comprises:
a plurality of word lines;
a plurality of bit lines crossing the word lines; and
a plurality of resistance change memory cells respectively formed at cross points between the word lines and the bit lines,
wherein the input unit comprises:
an access controller controlling access of data to a memory cell in time series, the data being expressed by a matrix;
a driver applying an voltage to a word line coupled to the memory cell which is an access destination of the data, the voltage being adjusted depending on a value of the data to be accessed to the memory cell, and
wherein the output unit comprises a plurality of holding circuits each holding a representative value of an output level of a corresponding one of the bit lines in time series,
wherein the memory cells periodically store a resistance value corresponding to a weight of a filter of a convolution operation using a neural network;
wherein the access controller comprises:
a shift circuit shifting the data which has been expanded from the matrix so as to be expressed by a one-dimensional array;
a control circuit controlling a shift amount and a shift direction of the shift circuit in time series based on a size and a stride of the filter and a size of the matrix; and
a coupling unit coupling the shifted data to the driver; and
wherein the coupling unit comprises a selection circuit selectively coupling the shifted data to the driver.

2. The semiconductor integrated circuit of claim 1, wherein the memory cell array comprises a plurality of selector elements respectively provided between the memory cells and the bit lines or the word lines.

3. The semiconductor integrated circuit of claim 2, wherein the voltage applied from the driver to the word line during an access control by the access controller corresponds to an off region of the selector element.

4. A semiconductor integrated circuit, comprising:
a cross point type memory cell array;
an input unit coupled to the memory cell array; and
an output unit coupled to the memory cell array,
wherein the memory cell array comprises:
a plurality of word lines;
a plurality of bit lines crossing the word lines; and
a plurality of resistance change memory cells respectively formed at cross points between the word lines and the bit lines,
wherein the input unit comprises:
an access controller controlling access of data to a memory cell in time series, the data being expressed by a matrix;
a driver applying an voltage to a word line coupled to the memory cell which is an access destination of the data, the voltage being adjusted depending on a value of the data to be accessed to the memory cell, and
wherein the output unit comprises a plurality of holding circuits each holding a representative value of an output level of a corresponding one of the bit lines in time series,
wherein the holding circuit comprises:
a plurality of conversion circuits respectively coupled to the bit lines and each converting a current flowing in the coupled bit line into a voltage; and
a plurality of peak hold circuits each holding a peak value of the voltage.

5. The semiconductor integrated circuit of claim 4, further comprising a plurality of comparison circuits binarizing an output of the peak hold circuit based on a reference voltage.

6. The semiconductor integrated circuit of claim 4, wherein the memory cell array comprises a plurality of selector elements respectively provided between the memory cells and the bit lines or the word lines.

7. The semiconductor integrated circuit of claim 6, wherein the voltage applied from the driver to the word line during an access control by the access controller corresponds to an off region of the selector element.

* * * * *